(12) United States Patent
Gupta et al.

(10) Patent No.: US 9,940,873 B2
(45) Date of Patent: Apr. 10, 2018

(54) ORGANIC LIGHT-EMITTING DIODE DISPLAY WITH LUMINANCE CONTROL

(71) Applicant: Apple Inc., Cupertino, CA (US)

(72) Inventors: Vasudha Gupta, Cupertino, CA (US); Chin-Wei Lin, Cupertino, CA (US); Shih Chang Chang, Cupertino, CA (US); Tsung-Ting Tsai, Taipei (TW); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 175 days.

(21) Appl. No.: 14/535,604

(22) Filed: Nov. 7, 2014

(65) Prior Publication Data

US 2016/0133184 A1    May 12, 2016

(51) Int. Cl.
| | |
|---|---|
| *G09G 5/10* | (2006.01) |
| *G09G 3/32* | (2016.01) |
| *G09G 3/3233* | (2016.01) |
| *G09G 3/3225* | (2016.01) |
| *G09G 3/3266* | (2016.01) |

(Continued)

(52) U.S. Cl.
CPC ......... *G09G 3/3233* (2013.01); *G09G 3/2081* (2013.01); *G09G 3/3225* (2013.01); *G09G 3/3266* (2013.01); *G11C 19/184* (2013.01); *G11C 19/28* (2013.01); *G09G 3/2011* (2013.01); *G09G 3/2014* (2013.01); *G09G 2310/0286* (2013.01); *G09G 2310/08* (2013.01); *G09G 2320/0233* (2013.01); *G09G 2330/028* (2013.01); *G09G 2360/16* (2013.01); *H03K 5/15093* (2013.01)

(58) Field of Classification Search
None
See application file for complete search history.

(56) References Cited

U.S. PATENT DOCUMENTS

| | | | |
|---|---|---|---|
| 6,069,597 | A | 5/2000 | Hansen |
| 8,264,453 | B2 | 9/2012 | Yang et al. |

(Continued)

FOREIGN PATENT DOCUMENTS

| | | |
|---|---|---|
| CN | 1885396 | 12/2006 |
| CN | 101978415 | 2/2011 |

(Continued)

OTHER PUBLICATIONS

Tsai, U.S. Appl. No. 14/687,081, filed Apr. 15, 2015.

*Primary Examiner* — Christopher R Lamb
(74) *Attorney, Agent, or Firm* — Treyz Law Group, P.C.; G. Victor Treyz; Jason Tsai (57) ABSTRACT

An organic light-emitting diode display may have an array of pixel circuits. Each pixel circuit may contain an organic light-emitting diode that emits light, a drive transistor that controls current flow through the diode, and additional transistors such as switching transistors for loading data into the pixel circuit and emission transistors for enabling and disabling current flow through the drive transistor and diode. Gate driver circuitry may produce emission control signals that control the emission transistors. Display driver circuitry may generate a start signal with a digitally controlled pulse width. The start signal may be applied to shift register circuitry in the gate driver circuitry. The pulse width of the start signal may be adjusted to adjust the luminance of the display.

20 Claims, 11 Drawing Sheets

(51) Int. Cl.
  *G11C 19/18* (2006.01)
  *G11C 19/28* (2006.01)
  *G09G 3/20* (2006.01)
  *H03K 5/15* (2006.01)

(56) References Cited

U.S. PATENT DOCUMENTS

| | | | |
|---|---|---|---|
| 8,305,370 B2 | 11/2012 | Song et al. | |
| 8,334,659 B2 | 12/2012 | Aurongzeb et al. | |
| 8,711,084 B2 | 4/2014 | Lee et al. | |
| 8,816,944 B2 | 8/2014 | Kim et al. | |
| 2003/0021449 A1 | 1/2003 | Pollard | |
| 2003/0098828 A1* | 5/2003 | Hunter | G09G 3/3233 345/76 |
| 2003/0174115 A1* | 9/2003 | Washio | G09G 3/3688 345/98 |
| 2003/0178947 A1* | 9/2003 | Shin | G09G 3/3266 315/169.3 |
| 2003/0214493 A1 | 11/2003 | Akimoto | |
| 2004/0104686 A1 | 6/2004 | Shin et al. | |
| 2005/0253835 A1* | 11/2005 | Kawase | G09G 3/3233 345/207 |
| 2006/0055687 A1 | 3/2006 | Sheu et al. | |
| 2006/0158394 A1* | 7/2006 | Choi | G09G 3/3266 345/76 |
| 2008/0123799 A1* | 5/2008 | Otose | G11C 19/28 377/68 |
| 2009/0167649 A1 | 7/2009 | Ishizuka | |
| 2011/0025679 A1 | 2/2011 | Park | |
| 2011/0102389 A1 | 5/2011 | Han | |
| 2012/0112940 A1* | 5/2012 | Sohn | H03M 1/162 341/141 |
| 2013/0082615 A1 | 4/2013 | Williams et al. | |
| 2014/0139139 A1 | 5/2014 | Li et al. | |
| 2014/0354698 A1 | 12/2014 | Lee et al. | |
| 2015/0061982 A1 | 3/2015 | Woo | |

FOREIGN PATENT DOCUMENTS

| | | |
|---|---|---|
| CN | 104282266 | 1/2015 |
| EP | 2701142 | 2/2014 |
| WO | 2006035246 | 4/2006 |

\* cited by examiner

FIG. 11

ORGANIC LIGHT-EMITTING DIODE DISPLAY WITH LUMINANCE CONTROL

BACKGROUND

This relates generally to displays, and, more particularly, to organic light-emitting diode displays.

Electronic devices often include displays. Organic light-emitting diode displays may exhibit desirable attributes such as a wide field of view, compact size, and low power consumption.

It can be challenging to adjust the luminance of organic light-emitting diode displays. Organic light-emitting diode displays have arrays of pixel circuits. Each pixel circuit contains an organic light-emitting diode. Each pixel circuit also has a drive transistor that is coupled to the organic light-emitting diode. The drive transistor in each pixel circuit can be adjusted to control the flow of drive current through the organic light-emitting diode. Uniformity issues may arise when the luminance of an organic light-emitting diode display is reduced by lowering drive current levels. For example, pixel-to-pixel color differences may be increased as drive current levels are reduced.

It would therefore be desirable to be able to provide improved ways to adjust display luminance in an organic light-emitting diode display.

SUMMARY

An organic light-emitting diode display may have an array of pixel circuits. Each pixel circuit may contain an organic light-emitting diode that emits light and a drive transistor that controls current flow through the diode. Each pixel circuit may also have additional transistors such as switching transistors for loading data into the pixel circuit and emission enable transistors for enabling and disabling current flow through the drive transistor and diode.

Data may be loaded into the array using data lines. Display driver circuitry may supply data to the data lines. Analog adjustments to the luminance of the display may be made by adjusting data values for the data that is loaded into the pixel circuits from the data lines. These luminance adjustments may be made, for example, at luminance levels above a predetermined amount.

The display driver circuitry may also generate a start signal with a digitally controlled pulse width. The start signal may be applied to the first stage in a series of linked stages that form a shift register. The shift register may produce output signals that serve as emission control signals for the emission enable transistors. Display luminance adjustments can be made by adjusting the pulse width of the start signal. For example, pulse width adjustments may be made at luminance levels below the predetermined amount. The pulse width adjustments adjust the luminance of the display by changing the duty cycle of the emission control signals.

DETAILED DESCRIPTION

Figure 1:
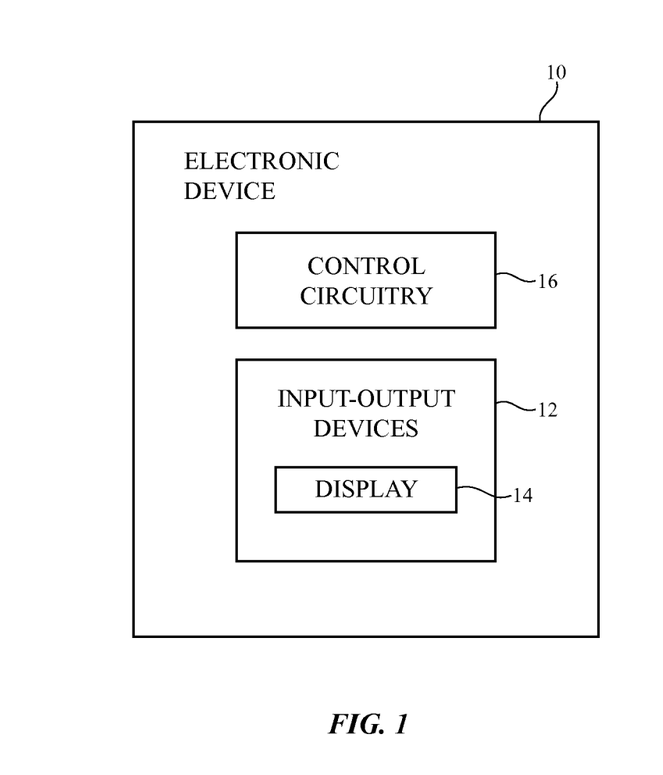
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
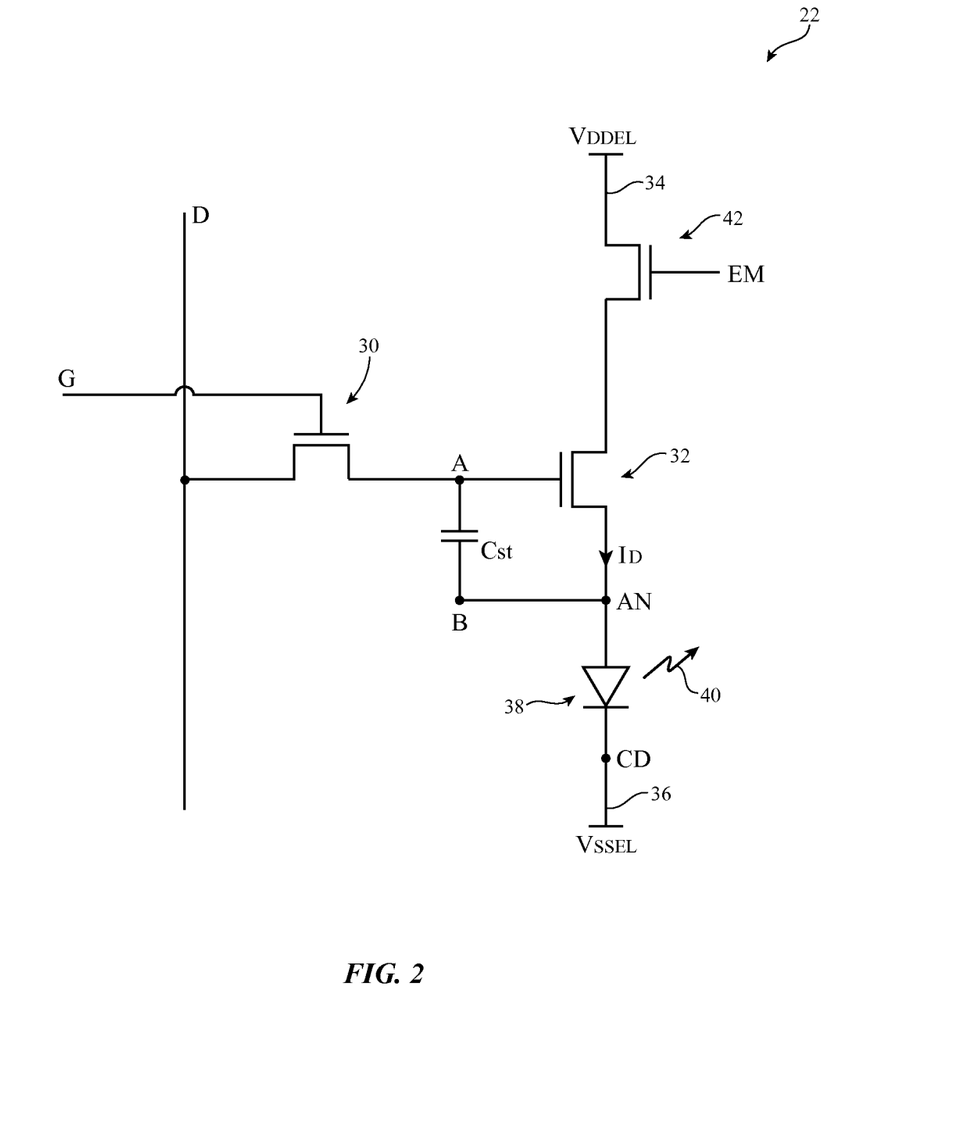
FIG. 2 is a diagram of an illustrative organic light-emitting diode pixel circuit in accordance with an embodiment.

Display 14 may be an organic light-emitting diode display. In an organic light-emitting diode display, each pixel contains a respective organic light-emitting diode. A schematic diagram of an illustrative pixel circuit for an organic light-emitting diode pixel is shown in FIG. 2. As shown in FIG. 2, pixel 22 may include light-emitting diode 38. A positive power supply voltage $V_{DDEL}$ may be supplied to positive power supply terminal 34 and a ground power supply voltage $V_{SSEL}$ may be supplied to ground power supply terminal 36. Diode 38 has an anode (terminal AN) and a cathode (terminal CD).

The state of drive transistor 32 controls the amount of drive current $I_D$ flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage).

To ensure that transistor 32 is held in a desired state between successive frames of data, display pixel 22 may include a storage capacitor such as storage capacitor Cst. The voltage on storage capacitor Cst is applied to the gate of transistor 32 at node A to control transistor 32 (i.e., to control the magnitude of drive current ID).

Data can be loaded into storage capacitor Cst using one or more switching transistors such as switching transistor 30. When switching transistor 30 is off, data line D is isolated from storage capacitor Cst and the gate voltage for transistor 32 on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38.

Pixel circuit 22 may have emission enable transistors such as transistor 42 (e.g., one or more transistors coupled in series with drive transistor 32 for enabling and disabling current flow through transistor 32). In the illustrative configuration of FIG. 2, a single emission transistor 42 is coupled between line 34 and transistor 32 and is controlled by emission control signals EM that are applied to the gate of transistor 42. Additional emission transistors may be incorporated into pixel circuit 22, if desired. In general, pixel circuit 22 may include any suitable number of transistors (e.g., 3-8 transistors, more than three transistors, fewer than 8 transistors, 6 transistor, etc.), any suitable number of storage capacitors (e.g., one or more capacitors, two capacitors, etc.), and any suitable number of scan and emission enable control lines and transistors. The configuration of FIG. 2 is merely illustrative.

Pixel circuits such as pixel circuit 22 may be operated in different phases. During threshold voltage and data loading operations, the control signals for the gate lines and emission enable lines may be used to perform sample-and-hold measurements that compensate pixel circuits 22 for pixel-to-pixel variations in the threshold voltage of drive transistor 32s. During an emission phase, current $I_D$ is driven through diode 38 by drive transistor 32 to control the intensity of light 40 that is output from diode 38 in each pixel circuit 22.

The luminance (brightness) of display 14 may be controlled by using a combination of analog and digital luminance adjustments for pixel circuits 22. During analog control operations, the values of the data being loaded into pixels 22 can be adjusted up or down to adjust drive currents for diode 38 up or down by a corresponding amount in an analog fashion. Larger drive currents will produce more output light 40 and small drive currents will produce less output light 40. This type of analog control scheme may be used in a brightness range of 1000 nits to 20 nits or other suitable range (e.g., at luminance values more than 20 nits or other suitable amount).

To prevent undesired uniformity variations of the type that might otherwise arise when using analog diming at low luminance levels, low level luminance adjustments (e.g., luminance adjustments at output intensities of 2 nits to 20 nits) may be made digitally by adjusting the duty cycle of the emission control signals for pixel circuits 22. Digital dimming in this type of arrangement may use pulse width modulation to control the light output from pixel circuits 22, rather than adjusting the value of drive current through transistor 32 and diode 38.

Figure 3:
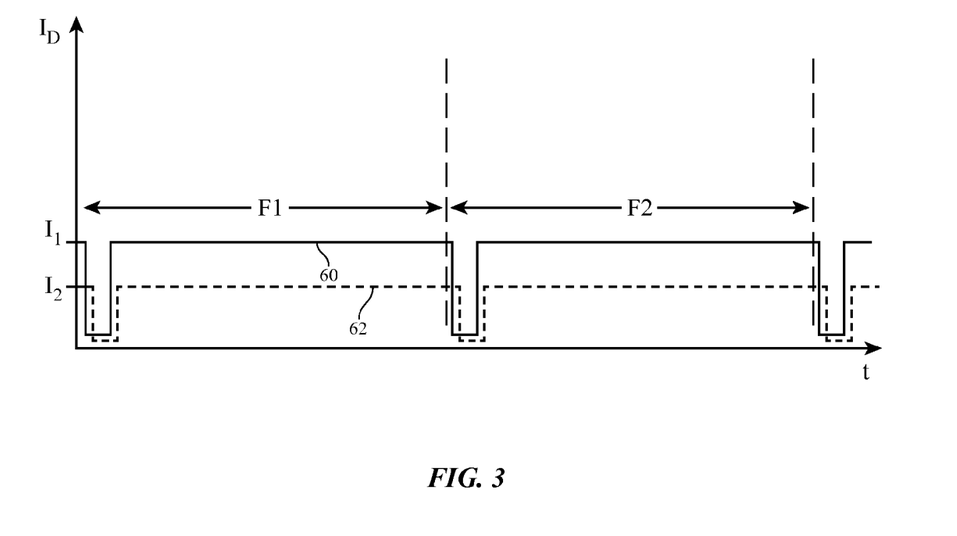
FIG. 3 is a graph in which pixel circuit drive current has been plotted as a function of time when a display is being operated at a first luminance level and in which drive current has been plotted as a function of time when the display is being operated at a second luminance level that has been lowered from the first luminance level using an analog luminance control scheme in accordance with an embodiment.

FIG. 3 is a graph showing how analog luminance adjustments may be made. In the graph of FIG. 3, drive current $I_D$ has been plotted as a function of time for multiple image frames F1, F2, . . . . As shown in FIG. 3, there is a brief period at the beginning of each frame in which drive current $I_D$ is interrupted to allow threshold voltage compensation operations to be performed. During the remainder of each frame, the value of drive current $I_D$ is held at a value that determines how brightly images are displayed on display 14. If drive current is high (see, e.g., curve 60), display 14 will be relatively bright. If drive current is reduced (see, e.g., curve 62), the luminance of display 14 will be reduced accordingly. The value of data D determines how strongly pixels 22 are driven. Analog reductions in D can be used to reduce drive current from the level of curve 60 (current $I_1$) to the level of curve 62 (current $I_2$) and thereby reduce output luminance of display 14 by a corresponding amount.

Figure 4:
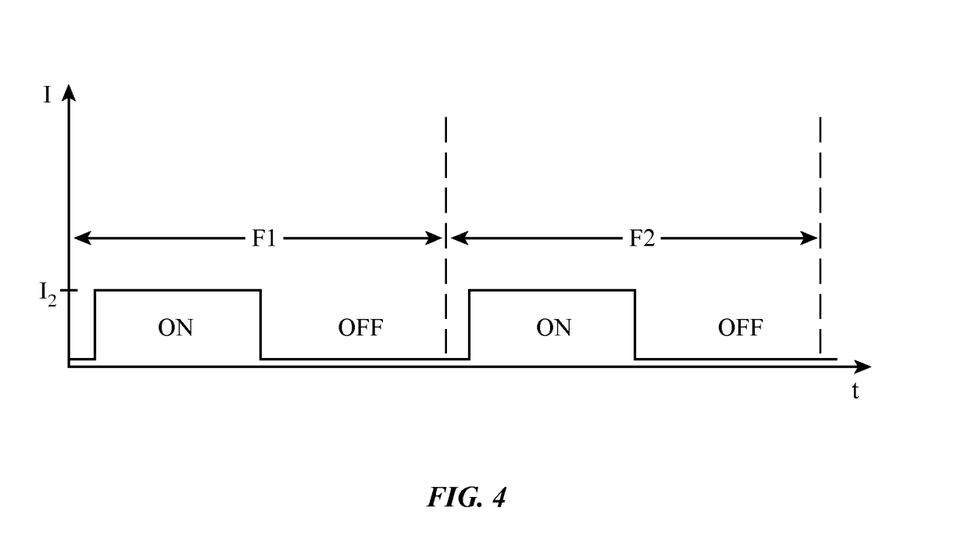
FIG. 4 is a graph in which pixel drive current has been plotted as a function of time when a display is being operated at a third luminance level that has been lowered from the second luminance level of FIG. 3 by digitally controlling the duty cycle of the drive current in accordance with an embodiment.

Pulse width modulation may be used to reduce luminance further. As shown in the graph of FIG. 4, for example, current I can be modulated to have both ON and OFF periods (e.g., by controlling the emission signal pulse width). When the pulse width of emission signals EM is large, diode 38 will be on for most or all of a given frame. When the pulse width of emission signal EM is small, diode 38 will be on for some of each frame and will be off for some of each frame. The ratio of the on to off periods determines the luminance of display 14. The pulse width of the emission signals in display 14 can be adjusted digitally allowing digital control of display luminance at low luminance values or other suitable luminance values. In the example of FIG. 4, the drive current for diode 38 has been cut in half by turning off the drive current for half of each frame. The peak drive current ($I_2$) that is flowing through the drive transistor is the same as the peak current $I_2$ of curve 62 of FIG. 3, but because the drive current is only flowing for half of each frame, luminance is reduced by a factor of two in comparison to the example of curve 62 of FIG. 3. Other reductions in luminance can be achieved by adjusting the pulse width of the emission signals. The configuration of FIG. 4 is merely illustrative.

Figure 5:
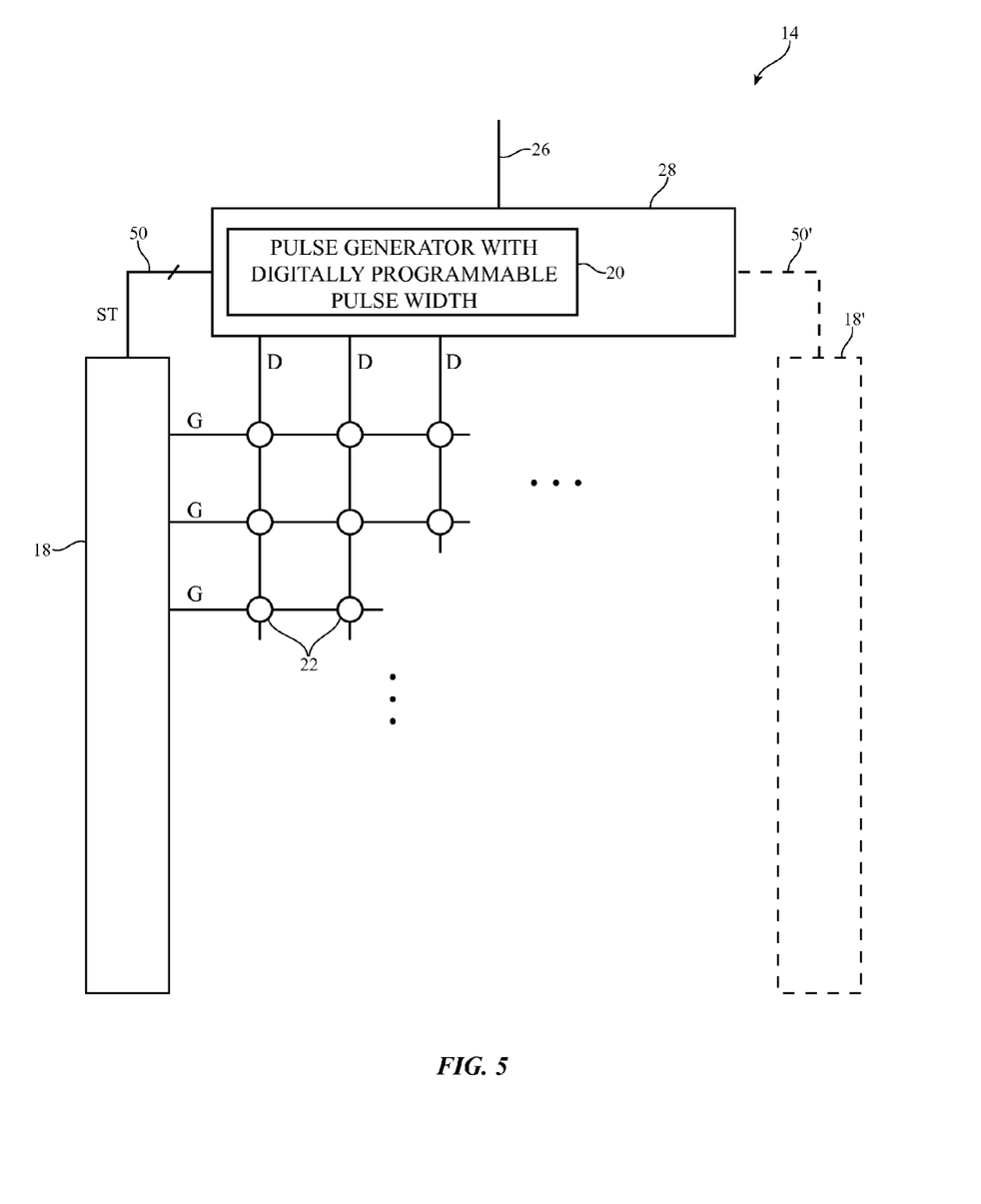
FIG. 5 is a diagram of an illustrative display in accordance with an embodiment.

FIG. 5 is a diagram of an illustrative display. As shown in FIG. 5, display 14 may have an array of display pixels 22 for displaying images for a user. Each display pixel may have a light-emitting diode such as organic light-emitting diode 38 of FIG. 2 and associated thin-film transistor circuitry (e.g., the pixel circuit of FIG. 2 or other suitable pixel circuit). The array of pixels 22 may be arranged to from rows and columns. There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired.

Display driver circuitry may be used to control the operation of pixels 22. The display driver circuitry may be formed from integrated circuits, thin-film transistor circuits, or other suitable circuitry. As shown in FIG. 5, display driver circuitry 28 (sometimes referred to as a timing controller chip) may contain communications circuitry for communicating with system control circuitry such as control circuitry 16 of FIG. 1 over path 26. Path 26 may be formed from traces on a flexible printed circuit or other cable. During operation, the control circuitry (e.g., control circuitry 16 of FIG. 1) may supply circuitry 28 with information on images to be displayed on display 14 (including luminance information).

To display the images on display pixels 22, display driver circuitry 28 may supply corresponding image data to data lines D while issuing clock signals and other control signals to supporting display driver circuitry such as gate driver circuitry 18 over path 50. If desired, circuitry 28 may also supply clock signals and other control signals to gate driver circuitry on an opposing edge of display 14 (see, e.g., path 50' and gate driver circuitry 18').

Circuitry 28 may contain pulse generator circuitry 20. Pulse generator circuitry 20 may create start pulses ST having a pulse width that is controlled digitally by circuitry 28 based on luminance information from control circuitry 16 that is received over path 26. The length of pulses ST may be used in adjusting the duty cycle of emission control signals in display 14 and therefore the duty cycle of diodes 38 and the luminance of display 14, as described in connection with the pulse width modulation scheme of FIG. 4.

Gate driver circuitry 18 (sometimes referred to as scan line driver circuitry or horizontal control line control circuitry) may be implemented as part of an integrated circuit such as circuit 28 and/or may be implemented using thin-film transistor circuitry. Horizontal control lines in display 14 may carry one or more gate line (scan line) signals G and one or more emission enable (emission) control signals EM for each row.

Figure 6:
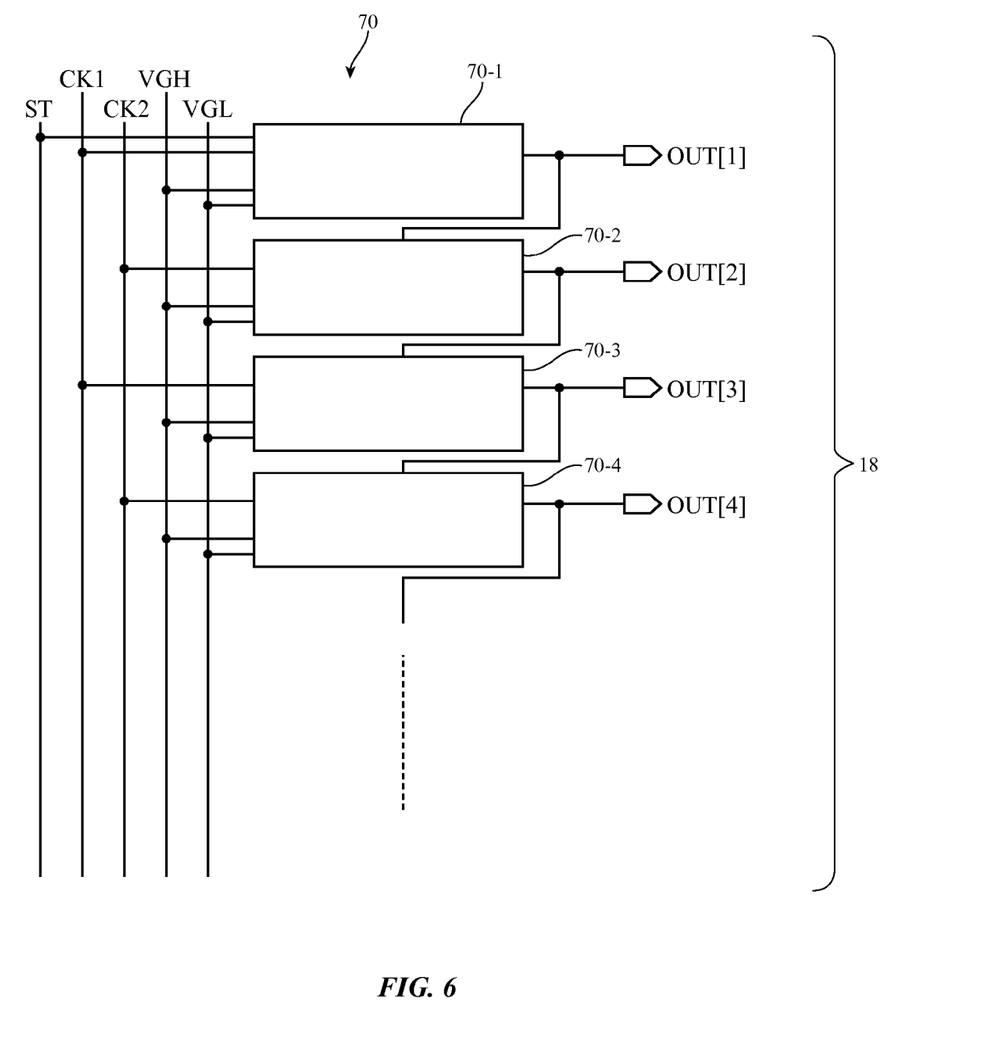
FIG. 6 is a diagram of illustrative gate driver circuitry that is being controlled using a two phase clock in accordance with an embodiment.

Gate driver circuitry 18 may include shift register circuitry. The shift register circuitry may include a series of linked shift register stages such as stages 70 of FIG. 6. Each shift register stage produces a corresponding output OUT that can serve as an emission control signal for a row of pixel circuits 22. Each output OUT is also applied to a successive shift register stage in circuitry 18 and serves as a trigger signal that directs the stage to produce its output signal. Because the first stage does not receive the output of any previous stages, shift register start signal ST is applied to the first stage of the shift register (i.e., stage 70-1 in the example of FIG. 6) to serve as a trigger signal for the first stage. High supply voltage VHG and low supply voltage VGL are supplied to all stages 70. The configuration of FIG. 6 uses two clock phases CK1 and CK2. Clock CK1 is applied to odd-row stages (see, e.g., stages 70-1 and 70-3 of FIG. 6). Clock CK2 is applied to even-row stages (see, e.g., stages 70-2 and 70-4).

Figure 7:
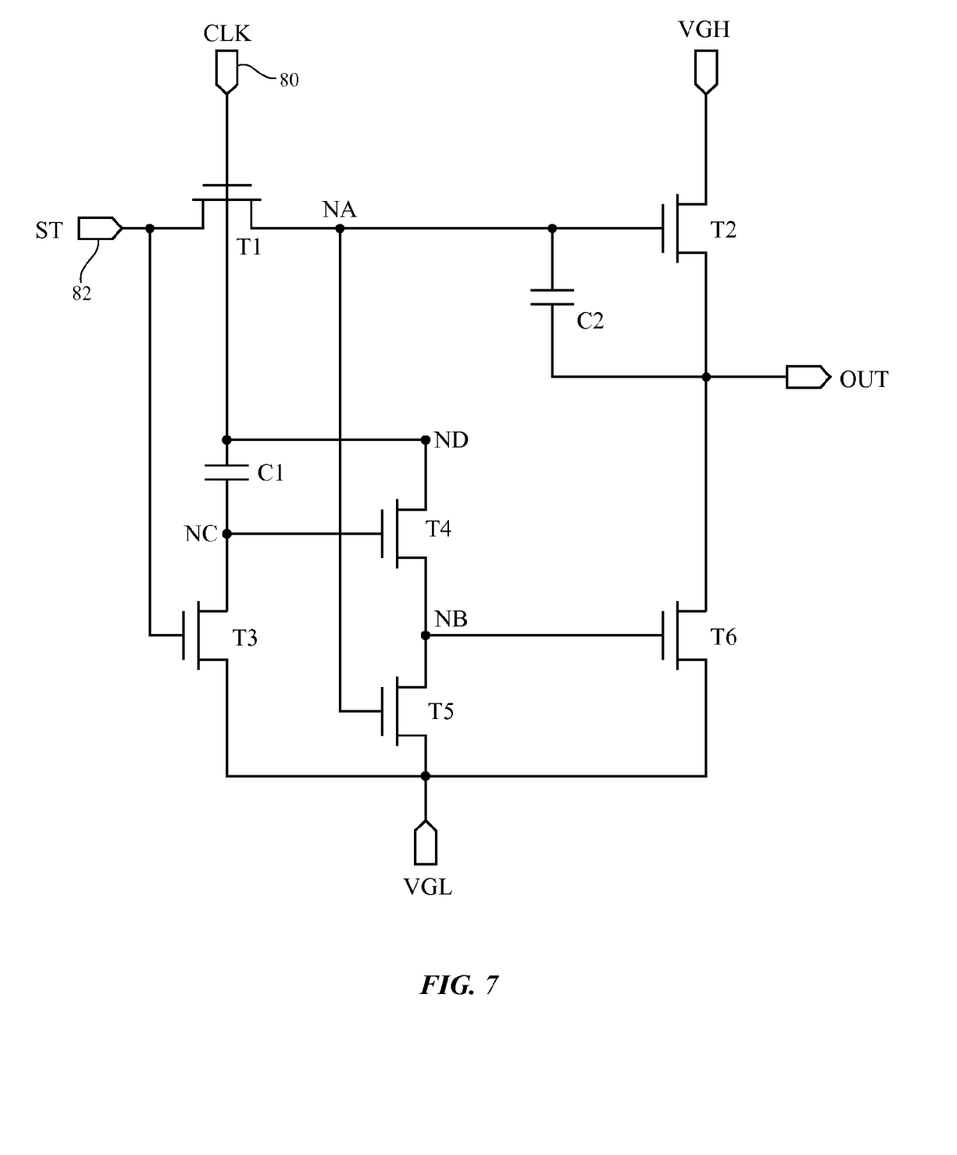
FIG. 7 is a circuit diagram of an illustrative gate driver stage of the type that may be used in the gate driver circuitry of FIG. 6 in accordance with an embodiment.

Each of the shift register stages may have a circuit of the type shown in FIG. 7. Input 80 (i.e., the CLK input) of stage 70 of FIG. 7 receives CK1 in odd rows and receives CK2 in even rows. In stage 70-1, input 82 receives adjustable-pulse-width start signal ST from circuitry 28. In subsequent stages (e.g., 70-2, 70-3, 70-4), inputs 82 receive the outputs OUT of previous stages.

In each row of display 14, output OUT is used as an emission control signal EM that is applied to the gates of emission transistors such as transistor 42 of FIG. 2 in that row.

Figure 8:
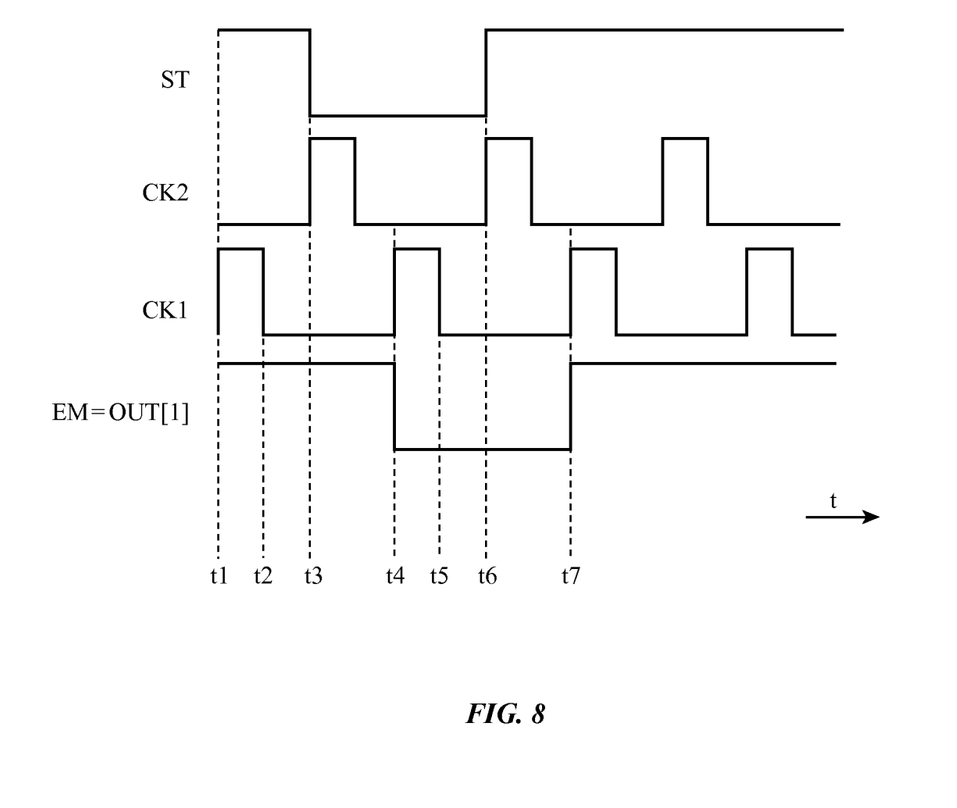
FIG. 8 is a timing diagram showing signals involved in operating gate driver circuitry of the type shown in FIGS. 6 and 7 in accordance with an embodiment.

FIG. 8 is a timing diagram showing how the pulse width of the output signal EM from stage 70 is controlled by the pulse width of start signal ST. In the example of FIG. 8, stage 70 is the first stage in the shift register (i.e., stage 70-1), so stage 70 receives clocks signal CK1 at input 80 and does not receive clock CK2. (In even rows, clock signal CK2 is applied to input 80 in place of clock signal CK1.)

At time t1, signal ST is high and clock CK1 goes high. In this situation, transistor T1 is turned on and node NA is taken high. Transistor T3 is on because ST is high, so node NC is pulled low to VGL (ground). This turns off transistor T4. The high signal on node NA turns on transistor T5. With transistor T4 off, node NB is pulled low and transistor T6 is turned off. With node NA high, transistor T2 is turned on. With transistor T2 on and transistor T6 off, signal OUT is high.

At time t2, clock CK1 goes low and transistor T1 is turned off. Node NA remains high and output OUT remains high.

At time t3, signal ST goes low, which turns off transistor T3. Node NA remains high and output OUT remains high.

At time t4, clock CK1 goes high for the first time since ST went low. This turns on transistor T1 and starts the low output pulse OUT (i.e., emission control signal EM is deasserted). In particular, turning on T1 causes the low signal on input 82 to be passed to node NA, so that node NA is taken low and transistor T2 is turned off. The low signal on input 82 holds transistor T3 off, so the high CK1 signal is passed to node NC through capacitor C1 and transistor T4 is turned on. The low signal on node NA turns transistor T5 off. With node NC high and transistor T5 off, transistor T4 is on and node NB is taken high. The high signal on node NB turns transistor T6 on. With transistor T6 on and transistor T2 off, OUT is taken low (deasserted).

Clock CK1 goes low at time t5. This turns off transistor T1 and takes node NC low through capacitor C1. With node NC low, transistor T4 is turned off. Output signal OUT remains low. The duration of the deasserted OUT signal is controlled by the duration of signal ST. Only after ST goes high, will the next edge of CK1 cause OUT (emission control signal EM) to be taken high (asserted).

After a desired amount of time (i.e., a desired off time for the light-emitting diode that will set display luminance for display 14 to a desired value), start signal ST is taken high (deasserted). In the example of FIG. 8, signal ST goes high at time t6, and turns on transistor T3. Output signal OUT remains low.

At time t7 (the first rising clock edge of CK1 following the low-to-high transition for start signal ST), clock CK1 goes high and turns on transistor T1. The high ST signal on input 82 passes to node NA. T5 is turned on by the high signal on node NA and pulls node NB low, turning off transistor T6. With node NA high, transistor T2 is on and output signal OUT is taken high (i.e., the low output pulse OUT is terminated and has the same length as input pulse ST).

In addition to serving as an emission signal for the pixels in a given row, the output signal OUT from each shift register stage is passed to the next shift register stage in the shift register. Accordingly, the length of the output signal pulse OUT (i.e., the emission control signal width) for all rows can be adjusted globally by controlling the duration of the ST pulse produced by pulse generator 20. The use of the controllable-width start pulse ST therefore enables global digital control of luminance in display 14. This pulse width modulation scheme may be used, for example, at relatively low luminance values to help sustain relatively large peak drive currents (see, e.g., current $I_2$ of FIG. 4), even as luminance is reduced. The use of larger peak drive current values at low luminance values can help improve uniformity in pixels 22 at low luminance values.

Figure 9:
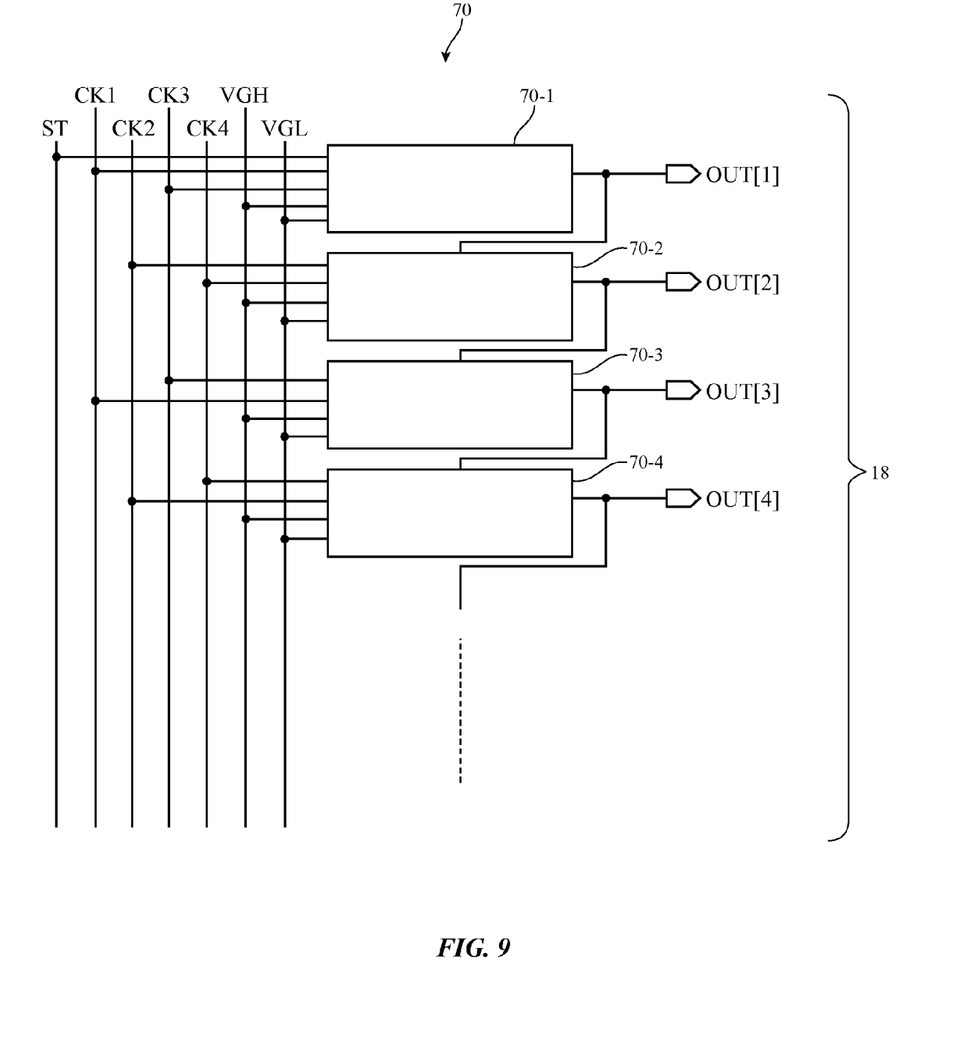
FIG. 9 is a diagram of illustrative gate driver circuitry that is being controlled using a four phase clock in accordance with an embodiment.
Figure 10:
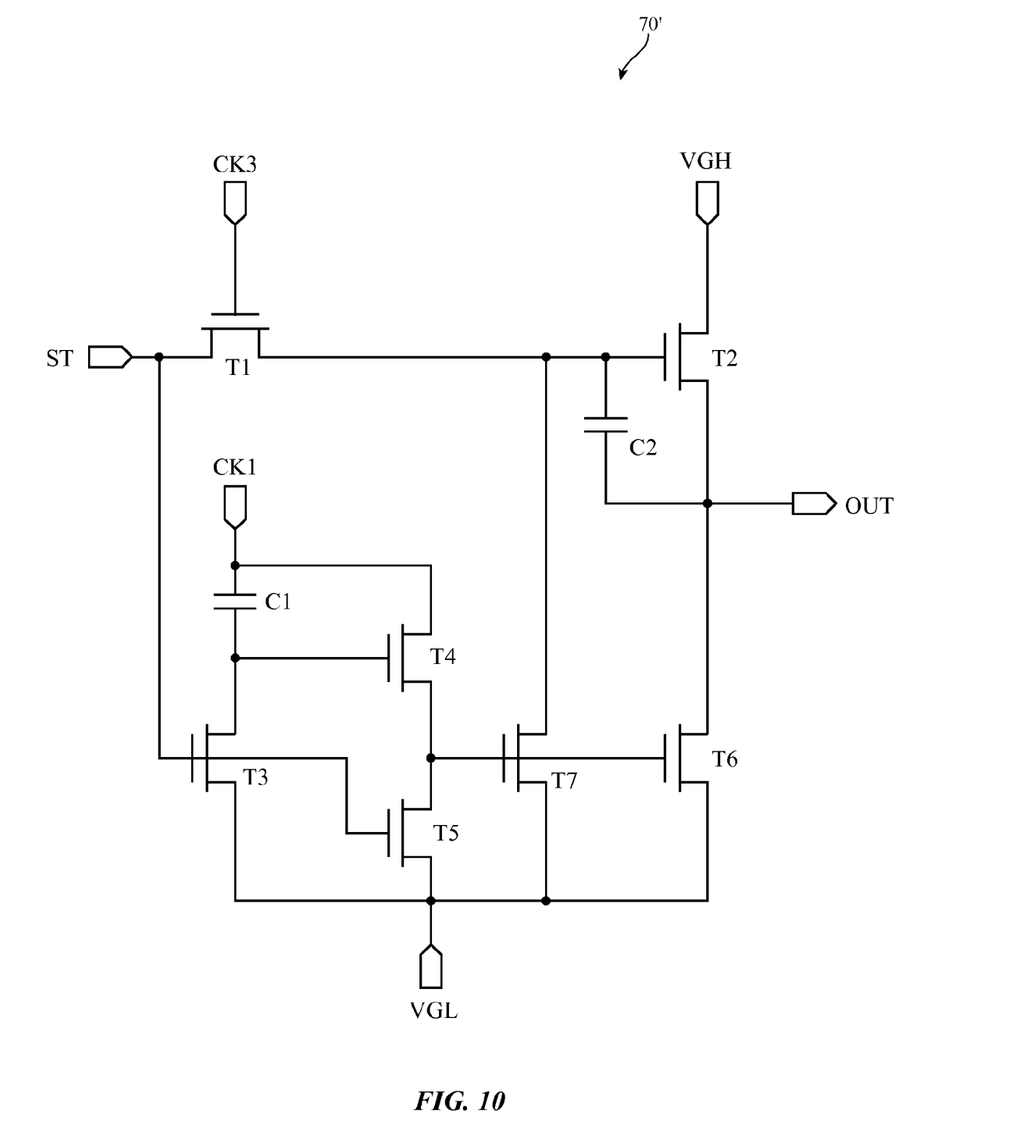
FIG. 10 is a circuit diagram of an illustrative gate driver stage of the type that may be used in the gate driver circuitry of FIG. 9 in accordance with an embodiment.

If desired, gate driver circuitry 18 may be operated using larger numbers of clock signals. As shown in FIG. 9, for example, circuitry 18 may have a four phase clock having clock signals CK1, CK2, CK3, and CK4. In this type of arrangement, each shift register stage (e.g., stages 70-1, 70-2, 70-3, 70-4 . . . ) may have an arrangement of the type shown by stage 70' of FIG. 10 in which the clock input is separated into two separate clock phase inputs (e.g., clock CK3 and CK1 in the FIG. 10 example). This allows the rising edge of signal OUT and the falling edge of signal OUT to be handled using different clock signals.

Figure 11:
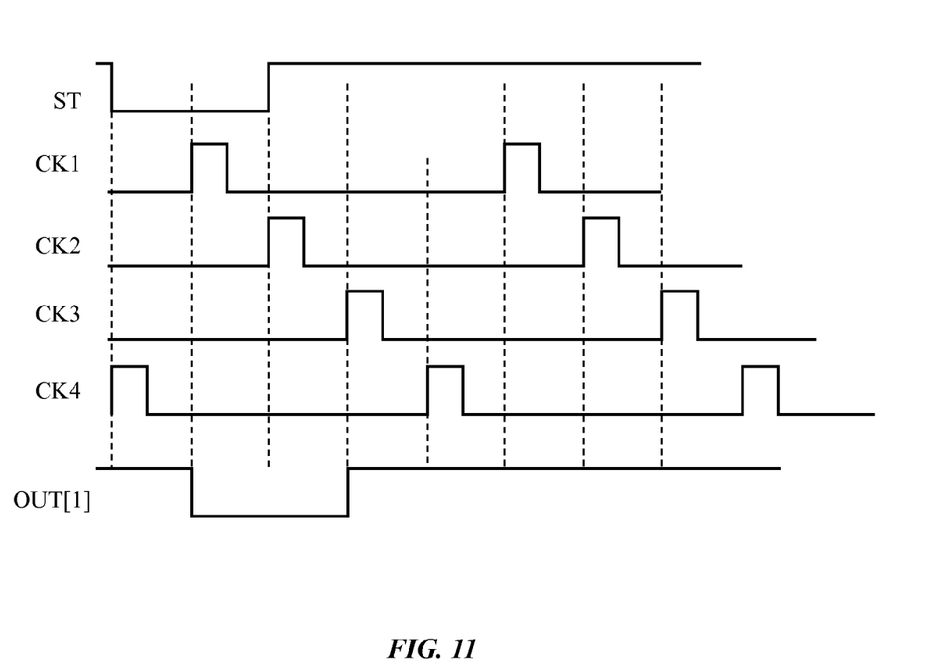
FIG. 11 is a timing diagram showing signals involved in operating gate driver circuitry of the type shown in FIGS. 9 and 10 in accordance with an embodiment.

FIG. 11 is a timing diagram showing how output signal OUT has a pulse width that is controlled by the pulse width of start signal ST. In the example of FIG. 8, output pulse OUT commences when CK1 goes high and terminates when CK1 goes high. In the example of FIG. 11, output pulse OUT commences when CK1 goes high and terminates when CK3 goes high. (In even rows, OUT commences when CK2 goes high and terminates when CK4 goes high.) In the two-phase clocking scheme, OUT rises and falls in synchronization with either the first phase or second phase, depending on the row in which the shift register stage that is producing the output is located. In a four-phase clocking scheme, signal OUT rises and falls in synchronization with either the first and third or the second and fourth clocks (depending on the shift register row producing signal OUT). The use of a four phase clock in place of a two phase clock may reduce capacitive loading on the clock lines, because fewer stages 70 are controlled by each clock line.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   an array of pixels each of which emits light to display an image on the display, wherein the image has a luminance;
   gate driver circuitry including shift register circuitry that supplies emission control signals, wherein the pixels receive the emission control signals, and wherein at least some of the emission control signals are fed back into the shift register circuitry; and
   display driver circuitry that supplies a start signal to the shift register circuitry, wherein the shift register circuitry comprises a transistor having a gate that directly receives the start signal from the display driver circuitry, wherein the start signal has a pulse width, and wherein the display driver circuitry adjusts the pulse width to adjust the luminance.

2. The display defined in claim 1 wherein the pixels comprise organic light-emitting diodes.

3. The display defined in claim 2 further comprising data lines that convey data signals to the array of pixels.

4. The display defined in claim 3 wherein the display driver circuitry comprises a pulse generator with a digitally programmable pulse width that supplies the start signal and wherein the luminance is digitally controlled by adjusting the pulse width with the pulse generator.

5. The display defined in claim 4 wherein the luminance is digitally controlled with the pulse generator for values of the luminance below a predetermined amount and is controlled using an analog control scheme in which the data signals are adjusted in magnitude for values of the luminance above the predetermined amount.

6. The display defined in claim 5 wherein each pixel circuit has at least one switching transistor that receives a scan line control signal and at least one emission enable transistor that receives the emission control signal.

7. The display defined in claim 6 wherein the array of pixels has rows and columns, wherein the shift register circuitry produces at least one of the emission control signals for each row in the array, and wherein the emission control signals have a duty cycle that is controlled by adjusting the pulse width with the pulse generator.

8. The display defined in claim 7 wherein the shift register circuitry has a plurality of stages and wherein each row contains one of the stages and receives the emission control signal for that row from that one of the stages.

9. The display defined in claim 8 wherein each stage has at least one clock input, wherein the display driver circuitry produces clock signals that are applied to the clock inputs of the stages in the shift register circuitry, and wherein the emission control signal rises and falls in synchronization with the clock signals.

10. The display defined in claim 8 wherein each stage has an input that receives an output from a previous stage and has an output at which the one of the emission control signals is provided.

11. An organic light-emitting diode display that displays images, comprising:
    an array of pixel circuits, each pixel circuit having a drive transistor and an emission transistor coupled in series with an organic light-emitting diode;
    display driver circuitry containing a programmable pulse generator that produces a start signal with a pulse width selected to adjust a luminance at which the images are displayed by the array of pixel circuits; and
    gate driver circuitry having shift register circuitry that receives the start signal and that supplies control signals to the array of pixel circuits, wherein the shift register circuitry includes a plurality of stages, each of which comprises:
    an output;
    a first transistor that has a gate terminal and that drives the output; and
    a second transistor having a gate terminal that receives a clock signal and a source terminal directly connected to the gate terminal of the first transistor.

12. The organic light-emitting diode display defined in claim 11 wherein an initial stage of the plurality of stages receives the start signal.

13. The organic light-emitting diode display defined in claim 12 wherein each stage produces at least one emission control signal with a duty cycle that is adjusted by adjusting the pulse width of the start signal and wherein adjusting the pulse width of the start signal adjusts the luminance.

14. The organic light-emitting diode display defined in claim 13 wherein each stage has a single clock input that receives clock signals from the display driver circuitry.

15. The organic light-emitting diode display defined in claim 13 wherein each stage has multiple clock inputs that receive clock signals from the display driver circuitry.

16. The organic light-emitting diode display defined in claim 13 the display driver circuitry makes both analog luminance adjustments in which peak current values for the drive transistor are adjusted and digital luminance adjustments in which the duty cycle is adjusted.

17. An organic-light-emitting diode display, comprising:
an array of pixels that displays an image with a given luminance;
shift register circuitry that produces emission control signals for rows of pixels in the array, wherein at least some of the emission control signals are fed back into the shift register circuitry, wherein the shift register circuitry includes a plurality of stages, each of which receives only two clock signals, and wherein the two clock signals are non-inverted versions of each other; and
display driver circuitry that adjusts the given luminance by adjusting a pulse width for a start signal provided to the shift register circuitry.

18. The organic light-emitting diode display defined in claim 17 wherein the shift register circuitry includes a plurality of stages and wherein the start signal is provided to a first of the plurality of stages.

19. The organic light-emitting diode display defined in claim 18 wherein the display driver circuitry provides four clock signals to the plurality of stages.

20. The organic light-emitting diode display defined in claim 19 wherein the stages include even row stages that produce emission control signals for even rows of the pixels, wherein the stages include odd row stages that produce emission control signals for odd rows of the pixels, wherein the only two clock signals received by each of the odd row stages comprise a first of the four clock signals and a third of the four clock signals at two separate clock inputs, and wherein the only two clock signals received by each of the even row stages receive a second of the four clock signals and a fourth of the four clock signals at two separate clock inputs.

* * * * *